US008679902B1

(12) United States Patent
Basker et al.

(10) Patent No.: US 8,679,902 B1
(45) Date of Patent: Mar. 25, 2014

(54) STACKED NANOWIRE FIELD EFFECT TRANSISTOR

(71) Applicant: International Business Machines Corporation, Armonk, NY (US)

(72) Inventors: Veeraraghavan S. Basker, Schenectady, NY (US); Tenko Yamashita, Schenectady, NY (US); Chun-chen Yeh, Clifton Park, NY (US)

(73) Assignee: International Business Machines Corporation, Armonk, NY (US)

( * ) Notice: Subject to any disclaimer, the term of this patent is extended or adjusted under 35 U.S.C. 154(b) by 0 days.

(21) Appl. No.: 13/628,726

(22) Filed: Sep. 27, 2012

(51) Int. Cl.
*H01L 21/335* (2006.01)

(52) U.S. Cl.
USPC ........... 438/142; 438/151; 438/290; 438/299; 257/E21.051; 257/E21.409

(58) Field of Classification Search
USPC .................. 438/151, 142, 275, 290, 299; 257/E21.051, E21.409
See application file for complete search history.

(56) References Cited

U.S. PATENT DOCUMENTS

| 7,588,977 | B2 | 9/2009 | Suk et al. | |
|---|---|---|---|---|
| 7,655,988 | B2* | 2/2010 | Jang et al. | 257/401 |
| 7,892,954 | B2 | 2/2011 | Balucani | |
| 7,928,017 | B2 | 4/2011 | Kim et al. | |
| 2006/0049429 | A1 | 3/2006 | Kim et al. | |
| 2007/0029586 | A1* | 2/2007 | Orlowski | 257/287 |
| 2008/0017934 | A1 | 1/2008 | Kim et al. | |
| 2008/0102586 | A1* | 5/2008 | Park | 438/290 |
| 2008/0135949 | A1 | 6/2008 | Lo et al. | |
| 2010/0207208 | A1* | 8/2010 | Bedell et al. | 257/346 |
| 2011/0031473 | A1* | 2/2011 | Chang et al. | 257/24 |
| 2011/0133162 | A1 | 6/2011 | Bangsaruntip et al. | |

OTHER PUBLICATIONS

Ben-Jamaa, M. Haykel et al., "Silicon Nanowire Arrays and Crossbars: Top-Down Fabrication Techniques and Circuit Applications", Science of Advanced Materials, vol. 3, No. 3, Jun. 2011, pp. 466-476.
Chan, Mansun et al., "3-D Matrix Nano-Wire Transistor Fabrication on Silicon Substrate", 10th IEEE International Conference on Solid-State and Integrated Circuit Technology (ICSICT), Nov. 1-4, 2010, pp. 883-886.
Dupre', C., et al. "15nm-diameter 3D Stacked Nanowires with Independent Gates Operation: oFET" IEEE International Electron Devices Meeting, IEDM, 2008; 4 Pages.

(Continued)

*Primary Examiner* — Julia Slutsker
(74) *Attorney, Agent, or Firm* — Cantor Colburn LLP; Vazken Alexanian

(57) ABSTRACT

A method for fabricating a nanowire field effect transistor device includes depositing a first sacrificial layer on a substrate, depositing a first layer of a semiconductor material on the first sacrificial layer, depositing a second sacrificial layer on the first layer of semiconductor material, depositing a second layer of the semiconductor material on the second sacrificial layer, patterning and removing portions of the first sacrificial layer, the first semiconductor layer, the second sacrificial layer, and the second semiconductor layer, patterning a dummy gate stack, removing the dummy gate stack, removing portions of the sacrificial layer to define a first nanowire including a portion of the first semiconductor layer and a second nanowire including a portion of the second semiconductor layer, and forming gate stacks about the first nanowire and the second nanowire.

18 Claims, 13 Drawing Sheets

(56) References Cited

OTHER PUBLICATIONS

Tachi, K., et al. "3D Source/Drain Doping Optimization in Multi-Chennel MOSFET", 2010 Proceedings of the European Solid-State Device Research Conference (ESSDERC), Sep. 14-16, 1010, pp. 368-371.

Zervas, Michael et al., "Top-down fabrication of very-high density vertically stacked silicon nanowire arrays with low temperature budget", Microelectronic Engineering, vol. 88, No. 10, Oct. 2011, pp. 3127-3132.

\* cited by examiner

STACKED NANOWIRE FIELD EFFECT TRANSISTOR

FIELD OF INVENTION

The present invention relates generally to field effect transistors, and more specifically, to nanowire field effect transistors.

DESCRIPTION OF RELATED ART

Nanowire field effect transistor (FET) devices include a nanowire arranged on a substrate. A gate stack is arranged conformally on a channel region of the nanowire. Source and drain regions of the nanowire extend outwardly from the channel region.

As the size of semiconductor devices decreases, it has become desirable to increase the density of the arrangement of FET devices on a substrate.

BRIEF SUMMARY

According to one embodiment of the present invention, a method for fabricating a nanowire field effect transistor device includes depositing a first sacrificial layer on a substrate, depositing a first layer of a semiconductor material on the first sacrificial layer, depositing a second sacrificial layer on the first layer of semiconductor material, depositing a second layer of the semiconductor material on the second sacrificial layer, pattering and removing portions of the first sacrificial layer, the first semiconductor layer, the second sacrificial layer, and the second semiconductor layer, patterning a dummy gate stack over a portion of the first sacrificial layer, the first semiconductor layer, the second sacrificial layer, and the second semiconductor layer, forming source and drain regions over exposed portions of the first sacrificial layer, the first semiconductor layer, the second sacrificial layer, and the second semiconductor layer, removing the dummy gate stack to define a cavity, removing exposed portions of the sacrificial layer to define a first nanowire including an exposed portion of the first semiconductor layer and a second nanowire including an exposed portion of the second semiconductor layer, and forming gate stacks about the first nanowire and the second nanowire.

According to another embodiment of the present invention, a method for fabricating a nanowire field effect transistor device includes depositing a first sacrificial layer on a substrate, depositing a first layer of a semiconductor material on the first sacrificial layer, depositing a second sacrificial layer on the first layer of semiconductor material, depositing a second layer of the semiconductor material on the second sacrificial layer, pattering and removing portions of the first sacrificial layer, the first semiconductor layer, the second sacrificial layer, and the second semiconductor layer, patterning a dummy gate stack over a portion of the first sacrificial layer, the first semiconductor layer, the second sacrificial layer, and the second semiconductor layer, forming source and drain regions over exposed portions of the first sacrificial layer, the first semiconductor layer, the second sacrificial layer, and the second semiconductor layer, removing the dummy gate stack to define a cavity, removing exposed portions of the substrate and removing a portion of the substrate arranged in the cavity below the first sacrificial layer, removing exposed portions of the sacrificial layer to define a first nanowire including an exposed portion of the first semiconductor layer and a second nanowire including an exposed portion of the second semiconductor layer, and forming gate stacks about the first nanowire and the second nanowire.

Additional features and advantages are realized through the techniques of the present invention. Other embodiments and aspects of the invention are described in detail herein and are considered a part of the claimed invention. For a better understanding of the invention with the advantages and the features, refer to the description and to the drawings.

BRIEF DESCRIPTION OF THE SEVERAL VIEWS OF THE DRAWINGS

The subject matter which is regarded as the invention is particularly pointed out and distinctly claimed in the claims at the conclusion of the specification. The forgoing and other features, and advantages of the invention are apparent from the following detailed description taken in conjunction with the accompanying drawings in which:

DETAILED DESCRIPTION

As the size of semiconductor devices decreases, it has become desirable to increase the number or density of FET devices arranged on the substrates of the semiconductor devices. In this regard, the methods and resultant devices described below provide for an arrangement of stacked nanowire FET devices. The stacking of the nanowire FET devices allows a number of FET devices to occupy a space on the substrate.

Figure 1:
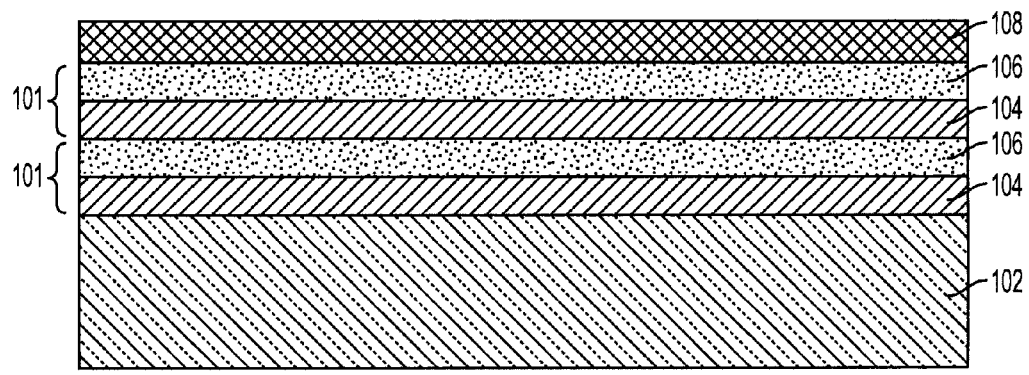
FIG. 1 illustrates a side view of a semiconductor-on-insulator (SOI) substrate.
Figure 2:
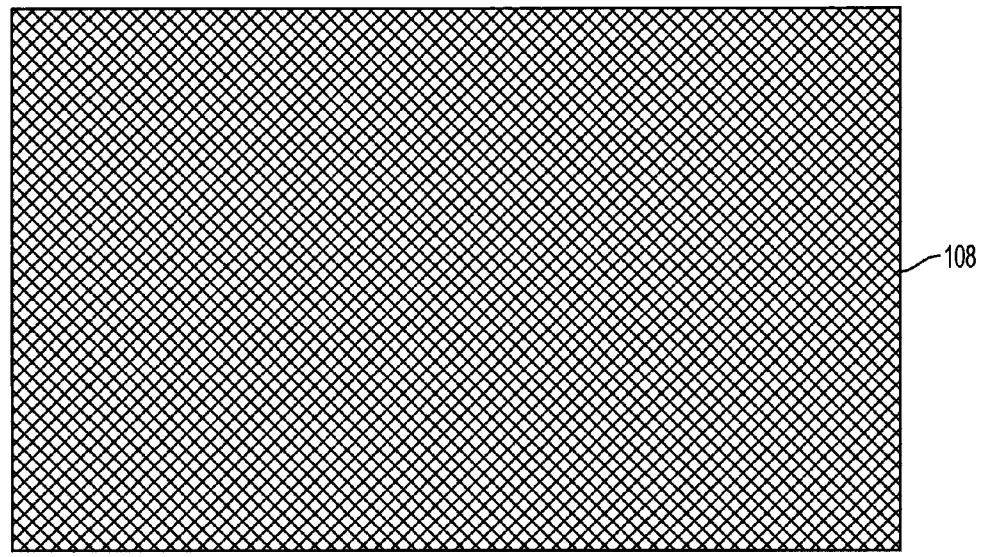
FIG. 2 illustrates a top view of FIG. 1.

FIG. 1 illustrates a side view and FIG. 2 illustrates a top view of a semiconductor-on-insulator (SOI) substrate having an insulator layer 102 and a sacrificial layer 104 including for example, a first semiconductor material such as, for example, SiGe, Ge, Si:C, and GaAs disposed on the insulator layer 102. A semiconductor layer 106 including a second semiconductor material such as, for example, Si is arranged on the sacrificial layer 104, a second sacrificial layer 104 is arranged on the semiconductor layer 106, and a second semiconductor layer 106 is arranged on the second sacrificial layer 104. A hardmask layer 108 that includes, for example, an oxide material is arranged on the second semiconductor layer 106. Though the illustrated embodiment includes two pairs 101 of sacrificial layers 104 and semiconductor layers 106, alternate embodiments may include any number of pairs 101. The first semiconductor material and the second semiconductor material include dissimilar materials. (The semiconductor material chosen for the semiconductor layer 106 will become the material used in the channel region of the nanowire FET device described below.)

Figure 3:
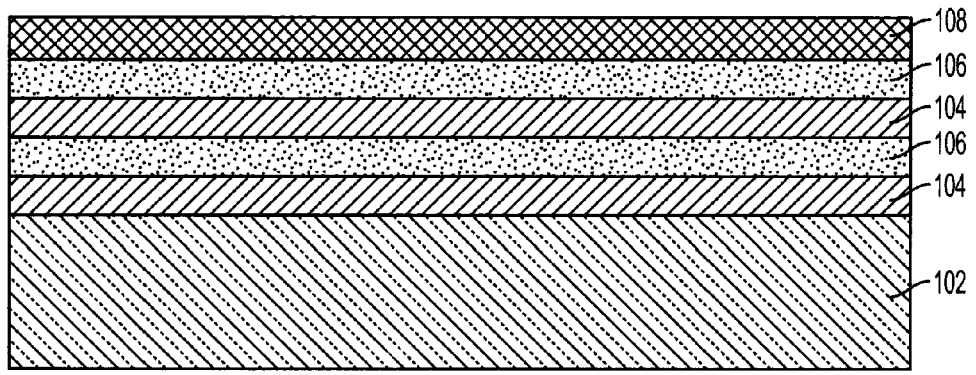
FIG. 3 illustrates a side view the patterning of the SOI substrate.
Figure 4:
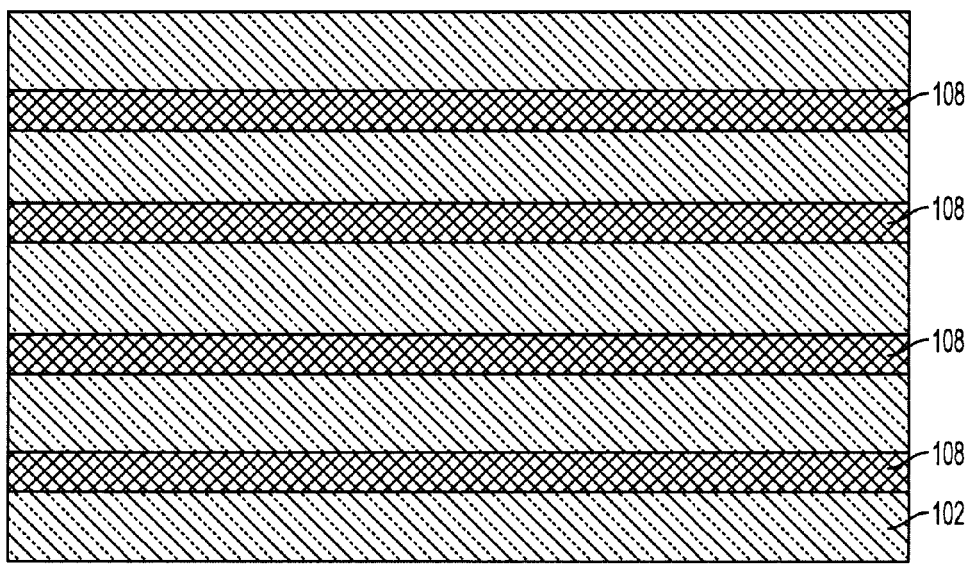
FIG. 4 illustrates a top view of FIG. 3.

FIG. 3 illustrates a side view and FIG. 4 illustrates a top view of the resultant structure following the patterning of the hardmask layer 108 and the pairs 101 of layers 104 and 106. The patterning may include, for example a photolithographic patterning and etching process such as, for example reactive ion etching (RIE) that removes exposed portions of the layers 104 and 106 and exposes portions the insulator layer 102.

Figure 5:
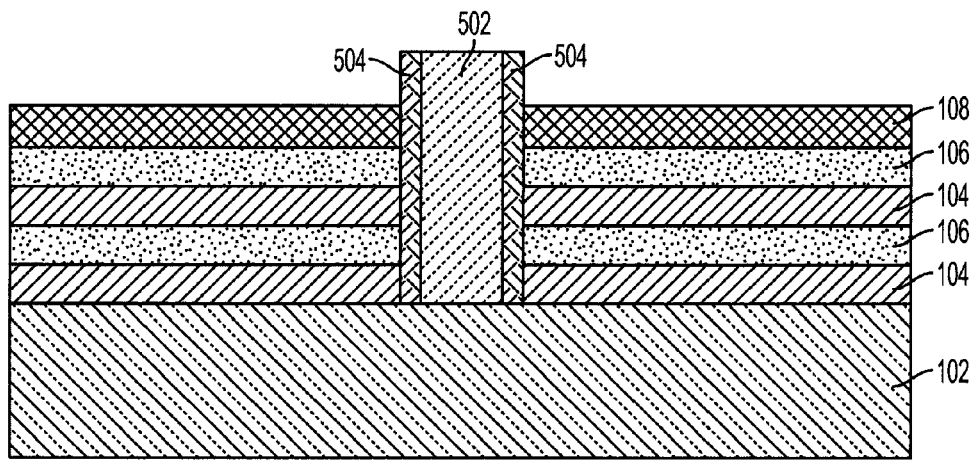
FIG. 5 illustrates a side view of the formation of a dummy gate stack.
Figure 6:
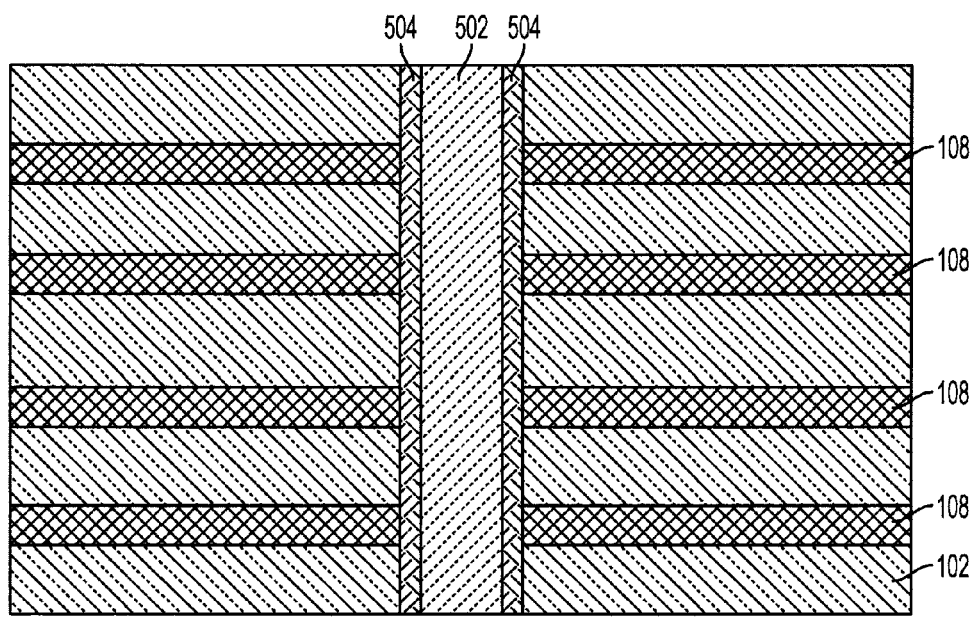
FIG. 6 illustrates a top view of FIG. 5.

FIG. 5 illustrates a side view and FIG. 6 illustrates a top view of the formation of a dummy gate stack 502 and spacers 504. The dummy gate stack 502 is formed by depositing a layer dummy gate stack material such as, for example, polysilicon conformally over the exposed portions of the insulator layer 102, the hardmask layer 108 and the layers 104 and 106. A photolithographic patterning and etching process is performed to remove exposed portions of the dummy gate stack material and pattern the dummy gate stack 502. The spacers 504 may be formed by, for example, depositing a conformal layer of spacer material such as a nitride or oxide material over the exposed portions of the insulator layer 102, the hardmask layer 108 and the layers 104 and 106 and the dummy gate stack 502. An etching process is performed to remove portions of the spacer material layer and define the spacers 504.

Figure 7:
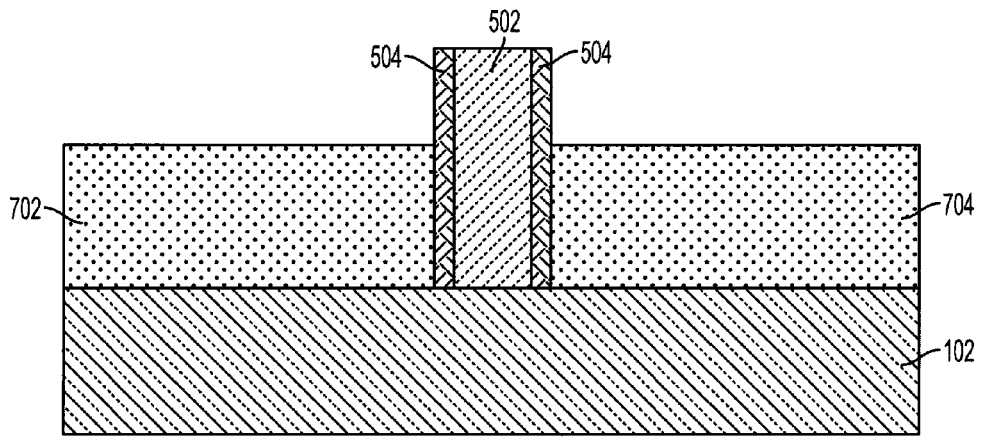
FIG. 7 illustrates a side view of the formation of source and drain regions 7.
Figure 8:
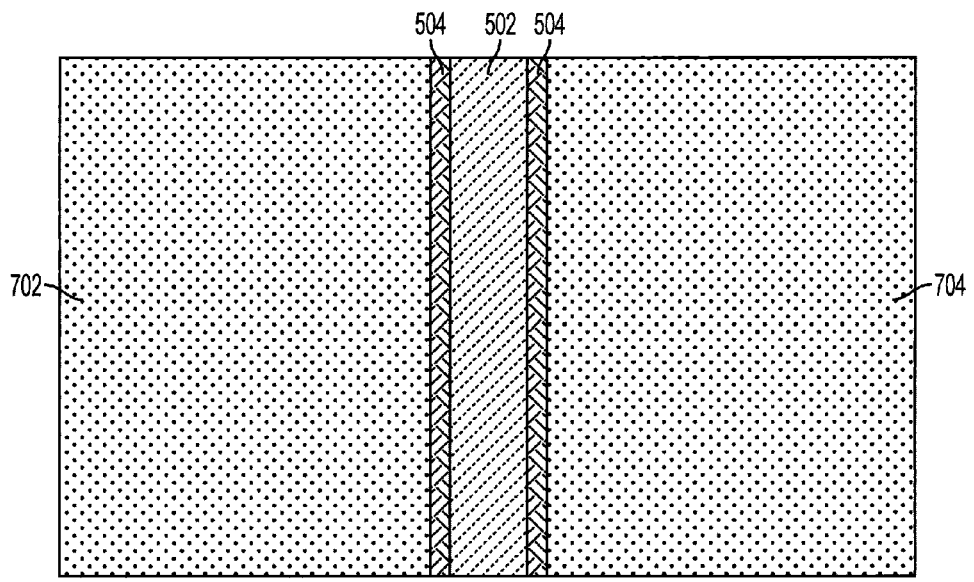
FIG. 8 illustrates a top view of FIG. 7.

FIG. 7 illustrates a side view and FIG. 8 illustrates a top view of the formation of source and drain regions 702 and 704 respectively. The source and drain regions 702 and 704 may be formed by, for example, removing the exposed portions of the hard mask layer 108 and performing an epitaxial growth process of an epitaxial semiconductor material such as, for example, epi-silicon or epi-germanium. The source and drain regions 702 and 704 may be doped with dopants, by for example, an ion implantation process, or during the epitaxial growth process.

Figure 9:
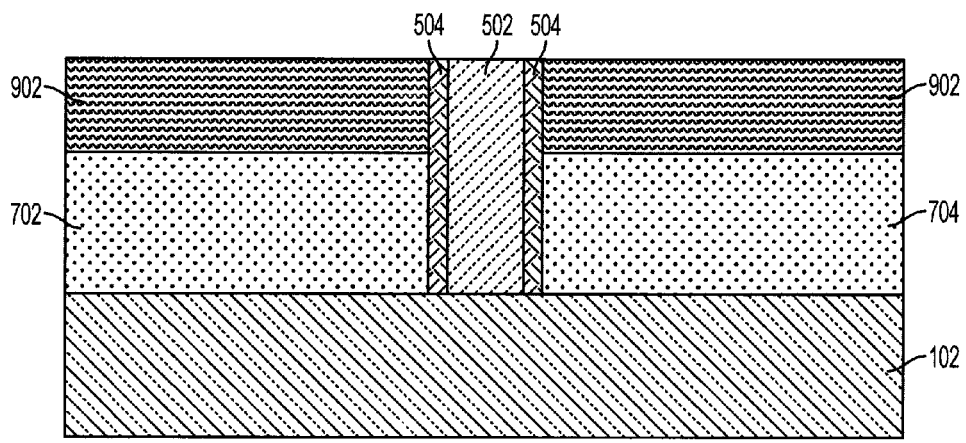
FIG. 9 illustrates a side view of the e formation of a capping layer.
Figure 10:
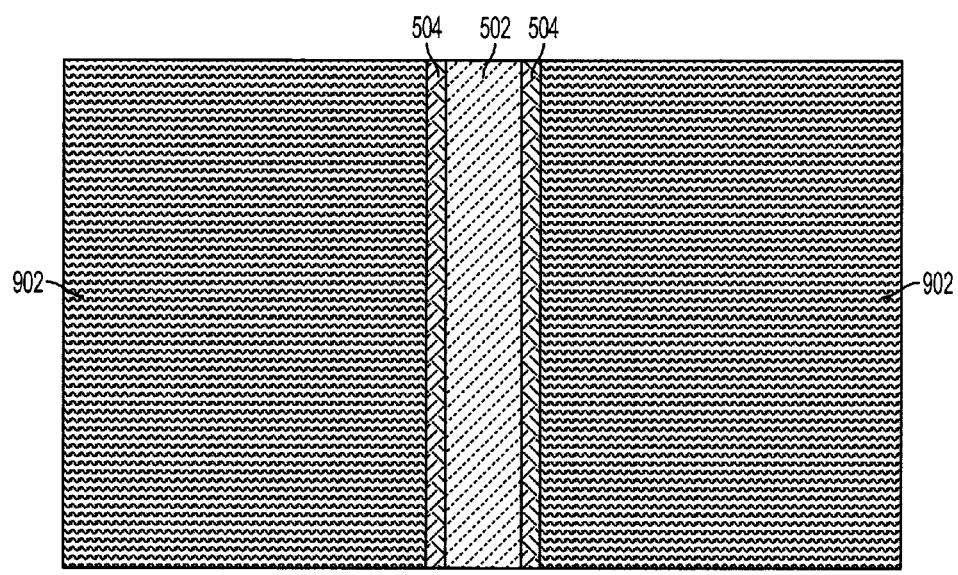
FIG. 10 illustrates a top view of FIG. 9.

FIG. 9 illustrates a side view and FIG. 10 illustrates a top view of the resultant structure following the formation of a capping layer 902 over the source and drain regions 702 and 704. The capping layer 902 may be formed by, for example, the deposition of a layer of insulator material such as an oxide or nitride material followed by a planarization process such as chemical mechanical polishing (CMP).

Figure 11:
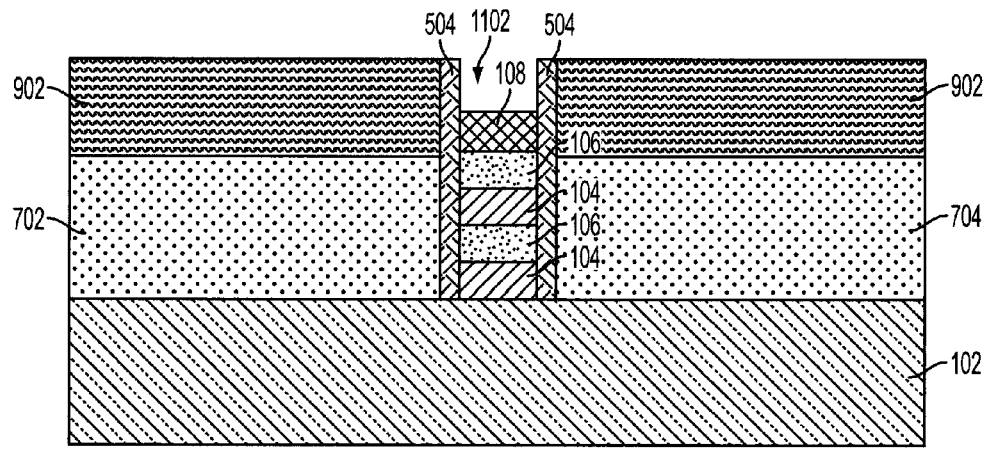
FIG. 11 illustrates a side view of the removal of the dummy gate stack.
Figure 12:
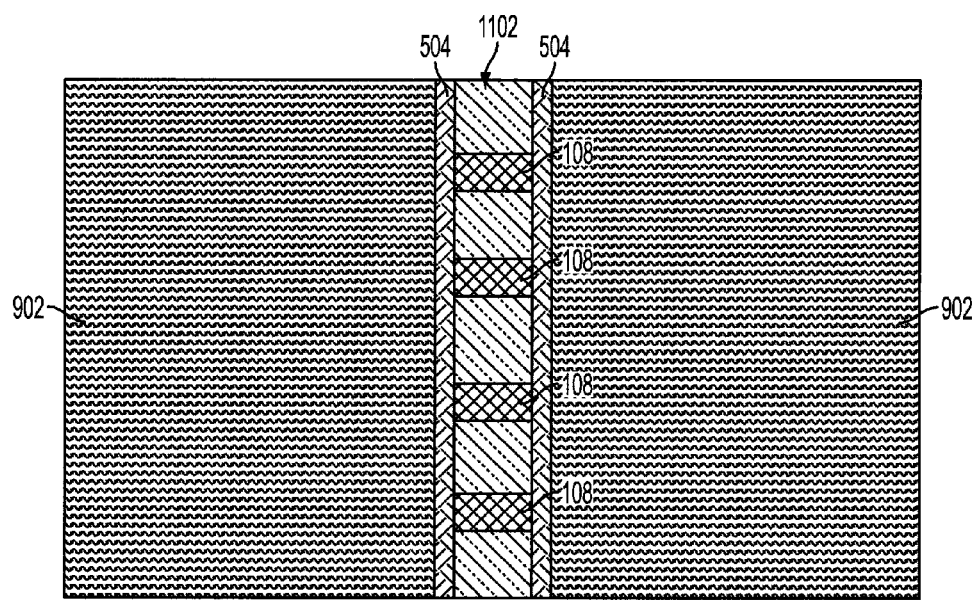
FIG. 12 illustrates a top view of FIG. 11.

FIG. 11 illustrates a side view and FIG. 12 illustrates a top view of the resultant structure following the removal of the dummy gate stack 502 (of FIG. 10). The dummy gate stack 502 may be removed by, for example, a selective etching process that removes the dummy gate stack 502. The removal of the dummy gate stack 502 forms a cavity 1102 that exposes portions of the hardmask 108, the insulator layer 102, and the pairs 101 of layers 104 and 106.

Figure 13:
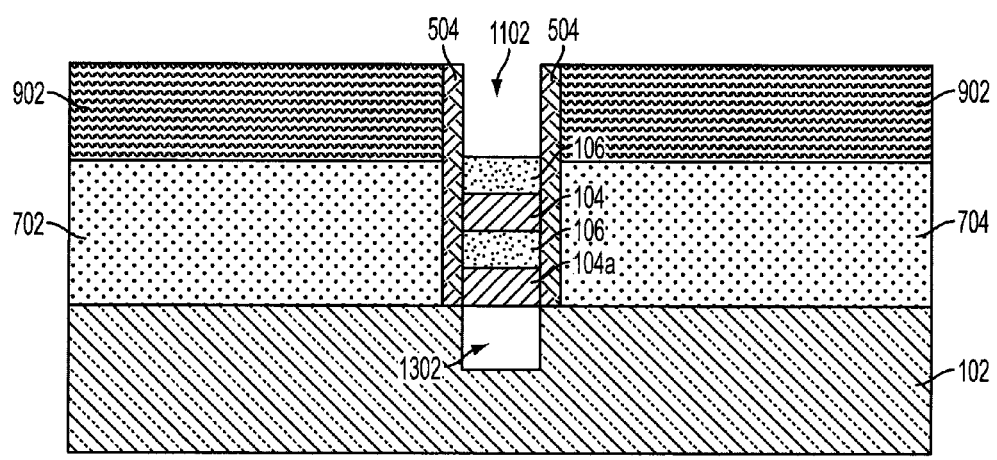
FIG. 13 illustrates a side view of the formation of an optional cavity.
Figure 14:
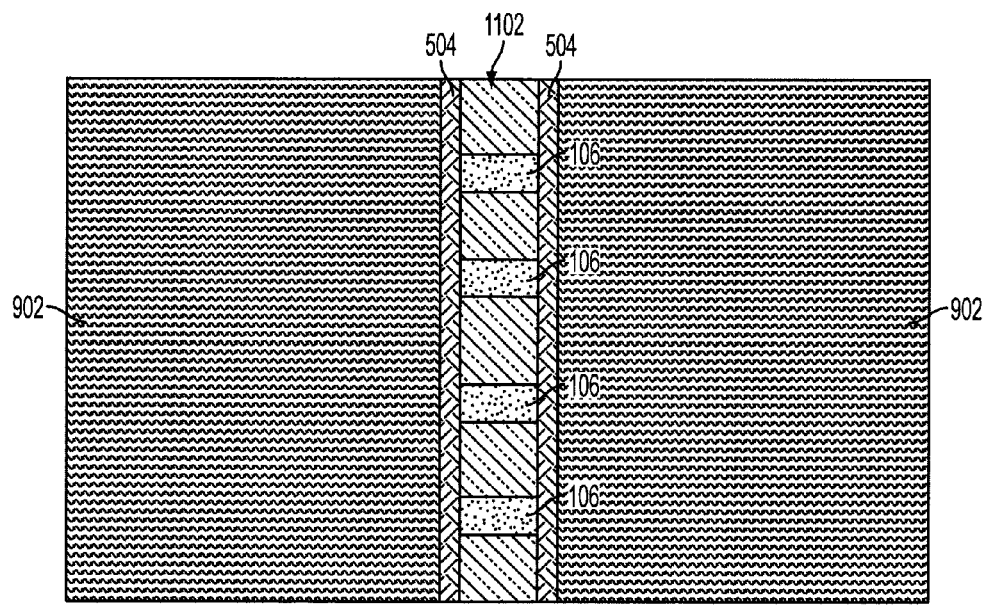
FIG. 14 illustrates a top view of FIG. 13.

FIG. 13 illustrates a side view and FIG. 14 illustrates a top view of the resultant structure following the formation of an optional cavity 1302 formed below the layers 104 and 106. In this regard, exposed portions of the insulator layer 102 may be removed using an anisotropic etching process. An isotropic etching process may be performed to remove regions of the insulator layer 102 below the first sacrificial layer 104a. Exposed portions of the hardmask layer 108 (of FIG. 11) may also be removed.

Figure 15:
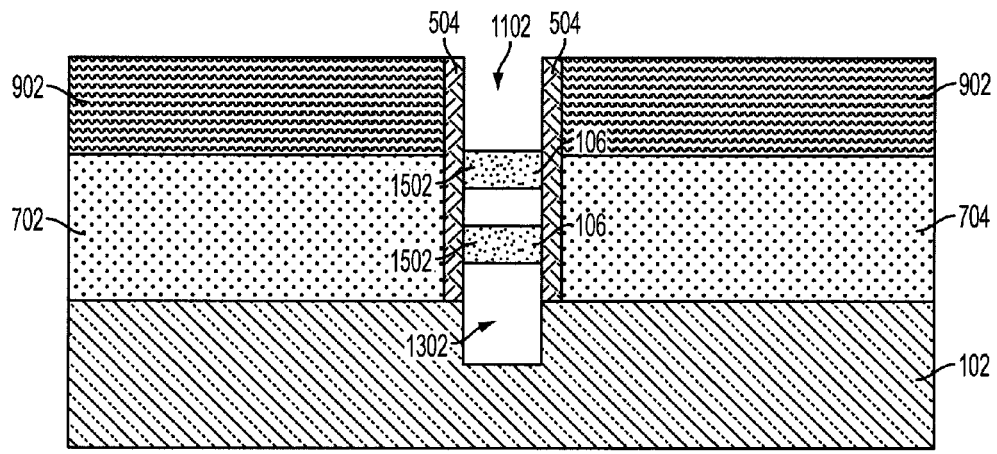
FIG. 15 illustrates a side view following the removal of exposed portions of the sacrificial layers.
Figure 16:
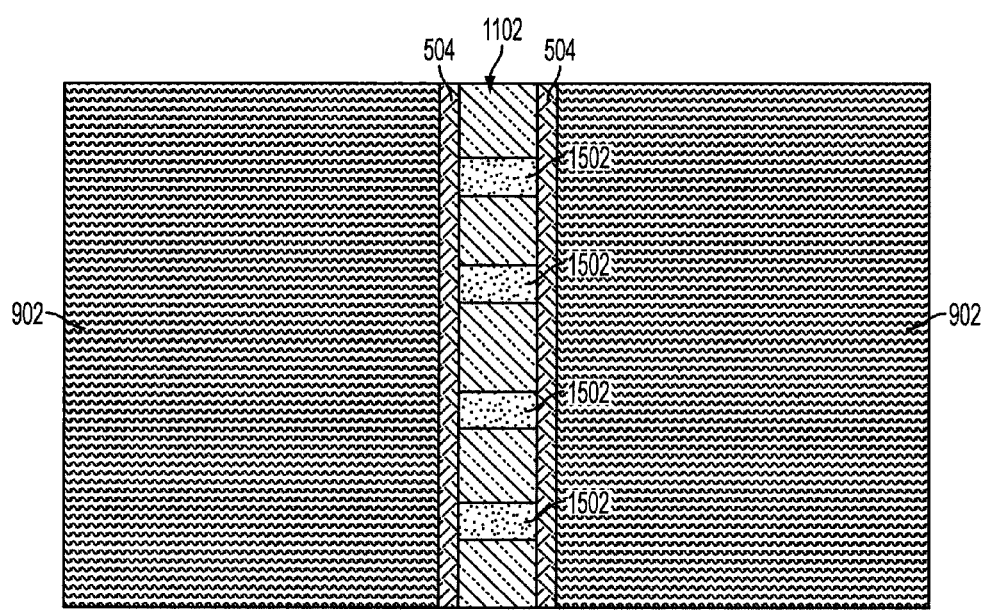
FIG. 16 illustrates a top view of FIG. 15.
Figure 17:
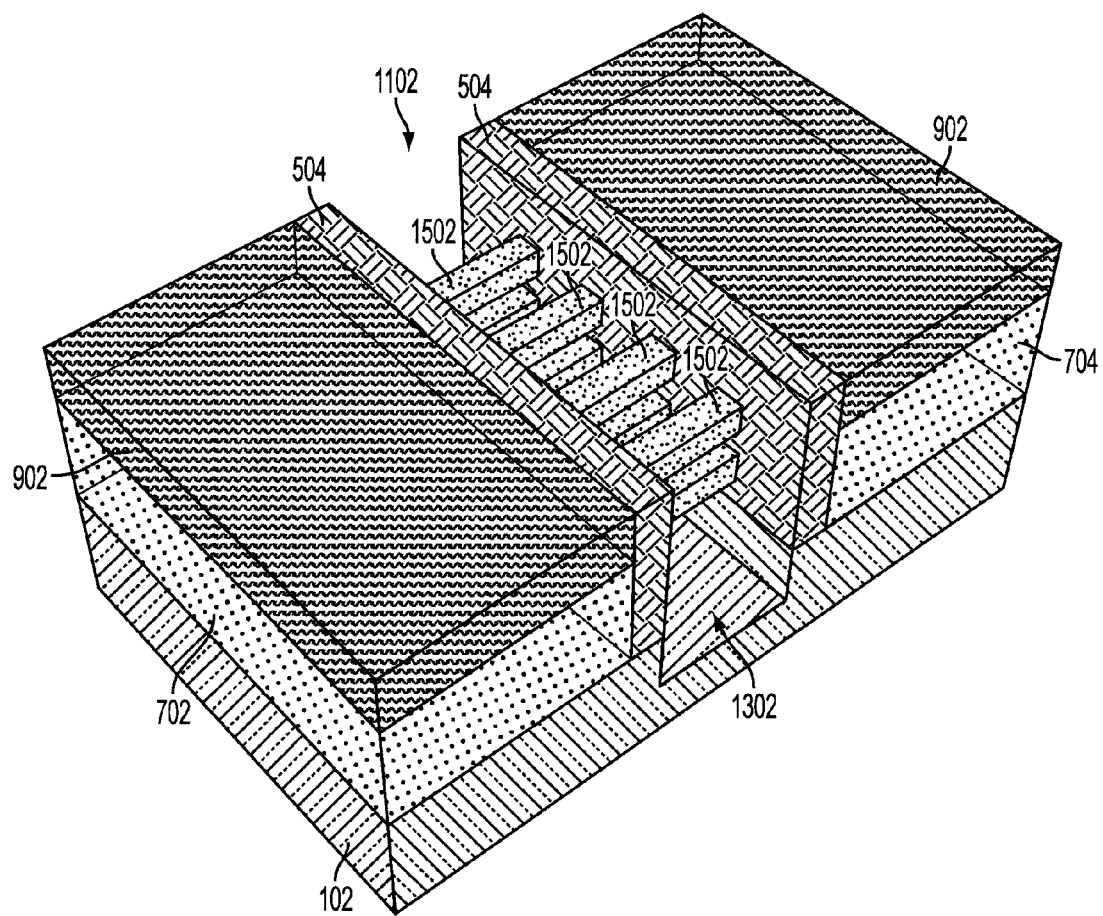
FIG. 17 illustrates a perspective view of FIG. 15.

FIG. 15 illustrates a side view, FIG. 16 illustrates a top view, and FIG. 17 illustrates a perspective view of the resultant structure following the removal of exposed portions of the sacrificial layers 104. The exposed portions of the sacrificial layers 104 may be removed with, for example, a selective isotropic etching process that removes the exposed portions of the sacrificial layers 104 (e.g., SiGe material) without appreciably removing exposed portions of the semiconductor layers 106 (e.g., Si material). The resultant structure defines nanowires 1502 arranged in the cavity 1102 that are suspended above the insulator layer 102.

Figure 18:
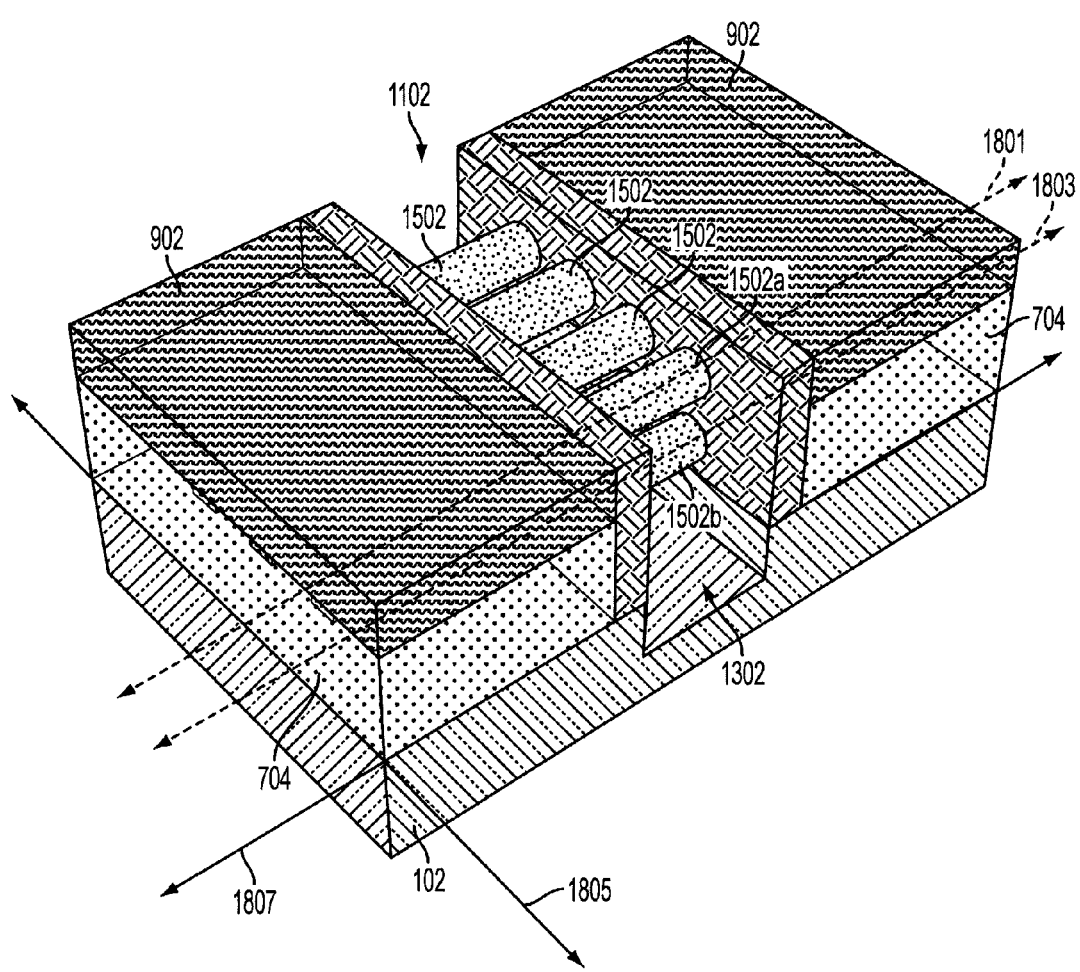
FIG. 18 illustrates a perspective view following an optional removal of portions of the nanowires.

FIG. 18 illustrates a perspective view of the resultant structure following an optional removal of portions of the nanowires 1502 to round the edges and reduce the size of the nanowires 1502 such that the nanowires 1502 have an elliptical cross-sectional shape. The nanowires 1502 may be rounded by, for example, performing a hydrogen annealing process. FIG. 18 includes lines 1801 and 1803 that illustrate the longitudinal axes of the nanowires 1502a and 1502b respectively. The longitudinal axes of the nanowires 1502a and 1502b define a plane that is substantially orthogonal to the plane defined by the lines 1805 and 1807 defined by the planar surface of the insulator layer 102 that is in contact with the source and drain regions 702 and 704.

Figure 19:
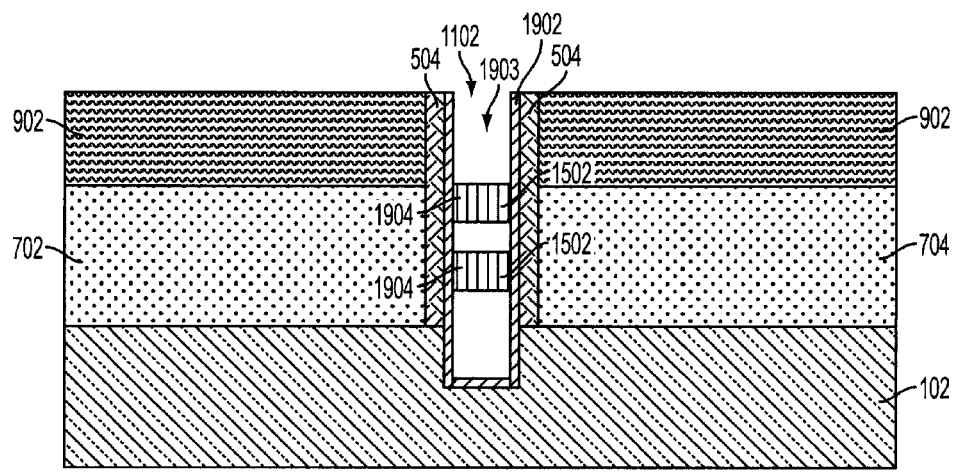
FIG. 19 illustrates a side view of the formation of a dielectric layer.
Figure 20:
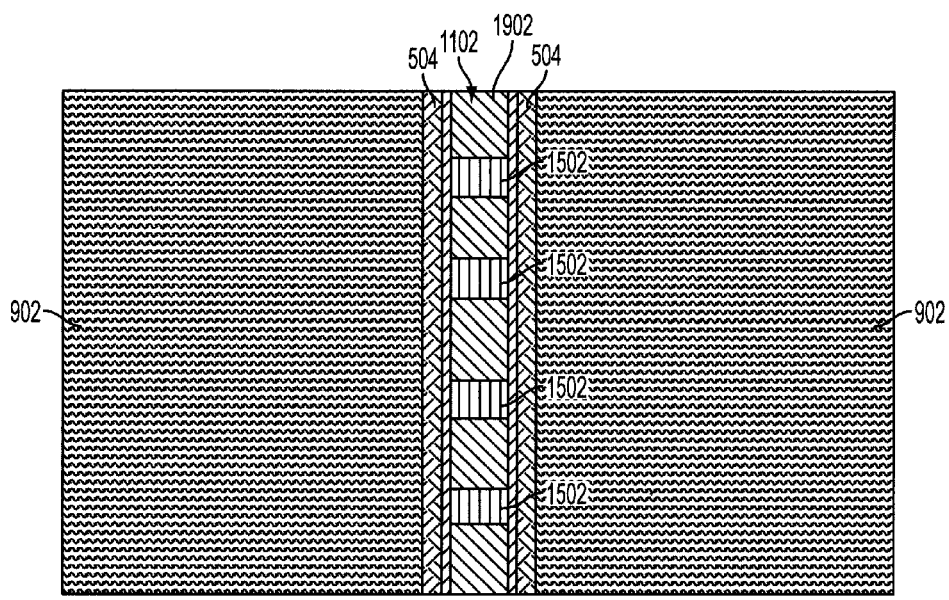
FIG. 20 illustrates a top view of FIG. 19.

FIG. 19 illustrates a side view and FIG. 20 illustrates a top view of the formation of a dielectric layer 1902 in the cavity 1102. The dielectric layer 1902 may include, for example, a high-K dielectric material that is formed conformally about the nanowires 1502. The dielectric layer 1902 may be formed along the sidewalls of the spacers 504 and over the exposed portions of the insulator layer 102. Following the formation of the dielectric layer 1902, a gate metal layer 1904 may be formed around the dielectric layer 1902 on the nanowires 1502. The dielectric layer 1902 and the metal gate layer 1904 formed about the nanowires 1502 define a gate stack 1903 arranged around a channel region of the nanowires 1502. The dielectric layer 1902 and the gate metal layer 1904 may each include a single layer of material or multiple layers of materials.

Figure 21:
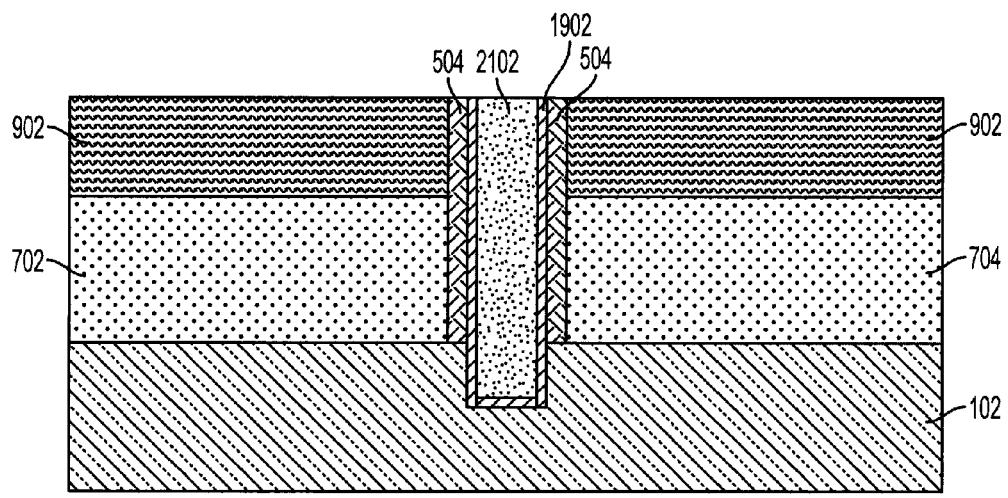
FIG. 21 illustrates a side view a capping layer formed in the cavity.
Figure 22:
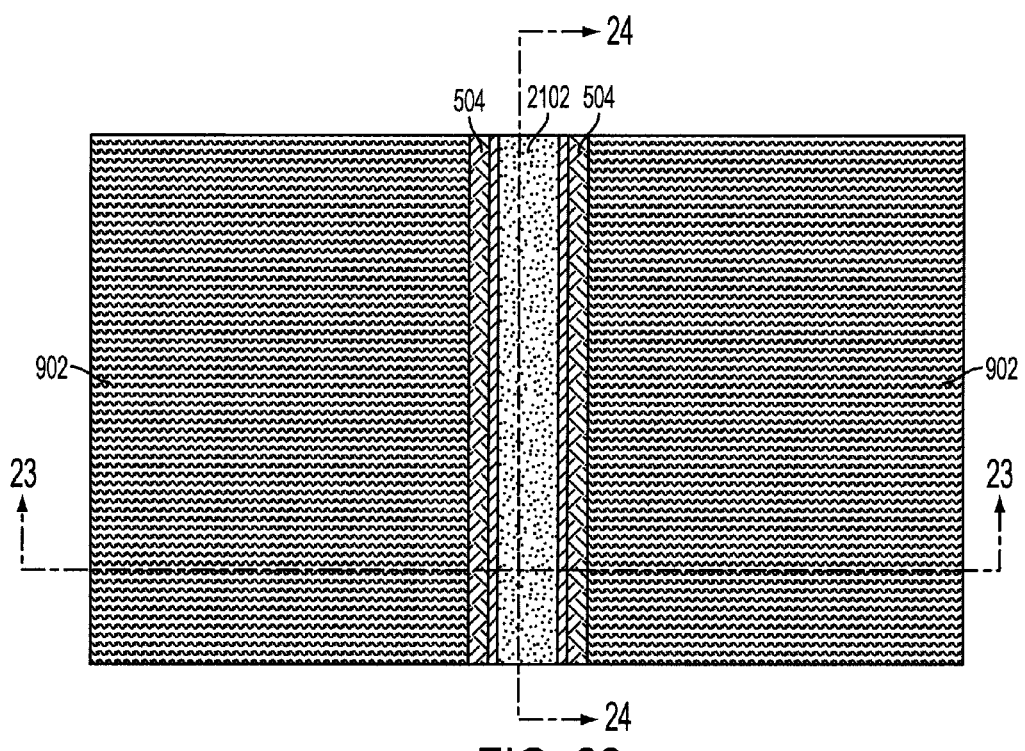
FIG. 22 illustrates a top view of FIG. 21.
Figure 23:
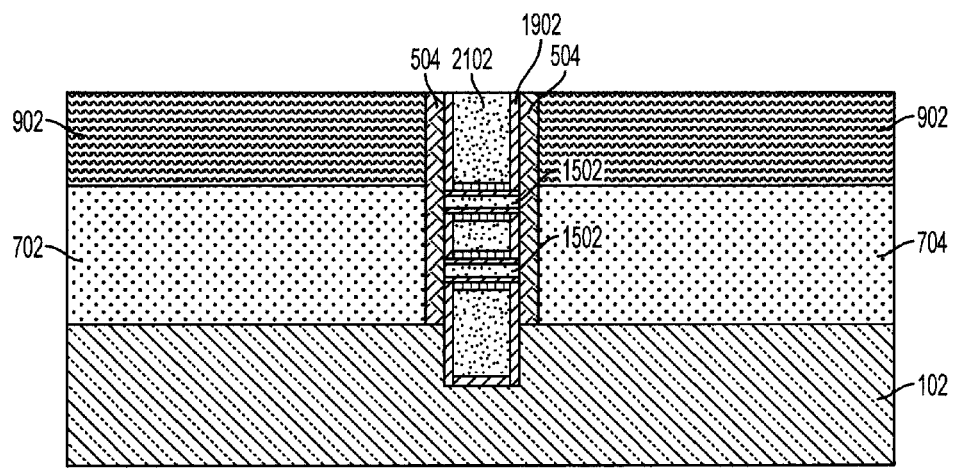
FIG. 23 illustrates a cut away view along the line 23 of FIG. 22.
Figure 24:
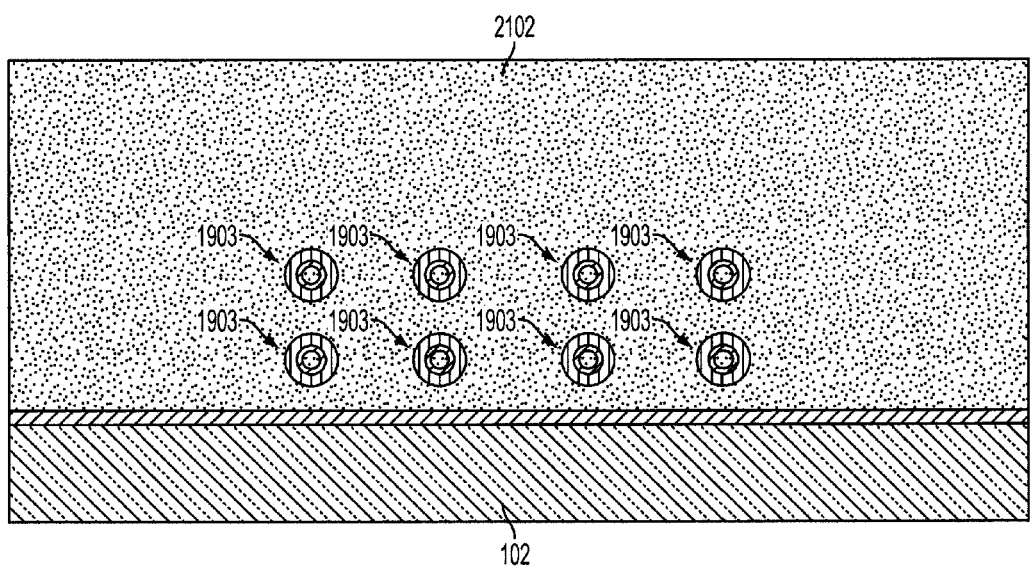
FIG. 24 illustrates a cut away view along the line 24 of FIG. 22.

FIG. 21 illustrates a side view and FIG. 22 illustrates a top view following the formation of a capping layer 2102 that is formed in the cavity 1102. The capping layer 2102 may include, for example, a polysilicon material that may be deposited in the cavity 1102 and about the nanowires 1502 (of FIG. 19). FIG. 23 illustrates a cut away view along the line 23 (of FIG. 22). FIG. 24 illustrates a cut away view along the line 24 (of FIG. 22).

Following the formation of the capping layer 2102, conductive vias (not shown) may be formed in the capping layer 902 to provide electrical contacts to the source and drain regions 702 and 704.

Though the illustrated embodiments include an arrangement of a single pair of vertically stacked FET devices, alternate embodiments may include any number of FET devices in a vertical stack. In such embodiments additional pairs 101 of layers 104 and 106 may be disposed on each other to provide for vertical stacks of nanowire FET devices having any number of nanowire FET devices in a vertical stack.

The illustrated exemplary embodiments provide for a method and resultant structure that includes nanowire FET devices disposed in a vertically stacked arrangement over an insulator substrate. Such an arrangement increases the density of the FET devices arranged on the substrate.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, element components, and/or groups thereof.

The corresponding structures, materials, acts, and equivalents of all means or step plus function elements in the claims below are intended to include any structure, material, or act for performing the function in combination with other claimed elements as specifically claimed. The description of the present invention has been presented for purposes of illustration and description, but is not intended to be exhaustive or limited to the invention in the form disclosed. Many modifications and variations will be apparent to those of ordinary skill in the art without departing from the scope and spirit of the invention. The embodiment was chosen and described in order to best explain the principles of the invention and the practical application, and to enable others of ordinary skill in the art to understand the invention for various embodiments with various modifications as are suited to the particular use contemplated.

The diagrams depicted herein are just one example. There may be many variations to this diagram or the steps (or operations) described therein without departing from the spirit of the invention. For instance, the steps may be performed in a differing order or steps may be added, deleted or modified. All of these variations are considered a part of the claimed invention.

While the preferred embodiment to the invention had been described, it will be understood that those skilled in the art, both now and in the future, may make various improvements and enhancements which fall within the scope of the claims which follow. These claims should be construed to maintain the proper protection for the invention first described.

What is claimed is:

1. A method for fabricating a nanowire field effect transistor device, the method comprising:
    depositing a first sacrificial layer on a substrate;
    depositing a first layer of a semiconductor material on the first sacrificial layer;
    depositing a second sacrificial layer on the first layer of semiconductor material;
    depositing a second layer of the semiconductor material on the second sacrificial layer;
    pattering and removing portions of the first sacrificial layer, the first semiconductor layer, the second sacrificial layer, and the second semiconductor layer;
    patterning a dummy gate stack over a portion of the first sacrificial layer, the first semiconductor layer, the second sacrificial layer, and the second semiconductor layer;
    forming source and drain regions over exposed portions of the first sacrificial layer, the first semiconductor layer, the second sacrificial layer, and the second semiconductor layer;
    forming spacers along sidewalls of the dummy gate stack prior to forming the source and drain regions, the spacers being retained in the nanowire field effect transistor device;
    removing the dummy gate stack to define a cavity;
    removing exposed portions of the first sacrificial layer and the second sacrificial layer to define a first nanowire including an exposed portion of the first semiconductor layer and a second nanowire including an exposed portion of the second semiconductor layer;
    forming dielectric layers along sidewalls of the spacers; and
    forming gate metal layers about the first nanowire and the second nanowire.

2. The method of claim 1, wherein the method further includes depositing a hardmask layer on the second semiconductor layer.

3. The method of claim 2, wherein the method further includes:
    pattering and removing portions of the hardmask layer while pattering and removing portions of the first sacrificial layer, the first semiconductor layer, the second sacrificial layer, and the second semiconductor layer, wherein the patterning of the dummy gate stack includes patterning the dummy gate stack over a portion of the hardmask layer, and
    removing exposed portions of the hardmask layer after removing the dummy gates stack.

4. The method of claim 1, wherein the forming the source and drain regions includes epitaxially growing a semiconductor material from exposed portions of the first semiconductor layer and the second semiconductor layer.

5. The method of claim 1, wherein the first sacrificial layer and the second sacrificial layer include a first semiconductor material and the first semiconductor layer and the second semiconductor layer include a second semiconductor material.

6. The method of claim 5, wherein the first semiconductor material includes SiGe, and the second semiconductor material includes Si.

7. The method of claim 1, wherein the method further comprises removing exposed portions of the substrate following the removal of the dummy gate stack and removing a portion of the substrate arranged in the cavity below the first sacrificial layer.

8. The method of claim 7, wherein the exposed portions of the substrate are removed with an anisotropic etching process, and the portion of the substrate arranged in the cavity below the first sacrificial layer is removed with an isotropic etching process.

9. The method of claim 1, further comprising removing exposed portions of the first nanowire and the second nanowire to define an elliptical cross-sectional shape in the first nanowire and the second nanowire following the removal of the dummy gate stack.

10. The method of claim 9, wherein the removing exposed portions of the first nanowire and the second nanowire to define the elliptical cross-sectional shape in the first nanowire and the second nanowire includes performing a hydrogen annealing process.

11. The method of claim 1, further comprising depositing a capping layer over the source region and the drain region prior to removing the dummy gate stack.

12. The method of claim 1, further comprising forming a capping layer in the cavity following the formation of the gate metal layers.

13. A method for fabricating a nanowire field effect transistor device, the method comprising:
depositing a first sacrificial layer on a substrate;
depositing a first layer of a semiconductor material on the first sacrificial layer;
depositing a second sacrificial layer on the first layer of semiconductor material;
depositing a second layer of the semiconductor material on the second sacrificial layer;
pattering and removing portions of the first sacrificial layer, the first semiconductor layer, the second sacrificial layer, and the second semiconductor layer;
patterning a dummy gate stack over a portion of the first sacrificial layer, the first semiconductor layer, the second sacrificial layer, and the second semiconductor layer;
forming source and drain regions over exposed portions of the first sacrificial layer, the first semiconductor layer, the second sacrificial layer, and the second semiconductor layer;
forming spacers along sidewalls of the dummy gate stack prior to forming the source and drain regions, the spacers being retained in the nanowire field effect transistor device;
removing the dummy gate stack to define a cavity;
removing exposed portions of the substrate and removing a portion of the substrate arranged in the cavity below the first sacrificial layer;
removing exposed portions of the first sacrificial layer and the second sacrificial layer to define a first nanowire including an exposed portion of the first semiconductor layer and a second nanowire including an exposed portion of the second semiconductor layer;
forming dielectric layers along sidewalls of the spacers; and
forming gate metal layers about the first nanowire and the second nanowire.

14. The method of claim 13, wherein the method further comprises forming the source and drain regions by epitaxially growing a semiconductor material from exposed portions of the first semiconductor layer and the second semiconductor layer prior to removing the dummy gate stack.

15. The method of claim 13, wherein the first sacrificial layer and the second sacrificial layer include a first semiconductor material and the first semiconductor layer and the second semiconductor layer include a second semiconductor material.

16. The method of claim 15, wherein the first semiconductor material includes SiGe, and the second semiconductor material includes Si.

17. The method of claim 13, further comprising removing exposed portions of the first nanowire and the second nanowire to define an elliptical cross-sectional shape in the first nanowire and the second nanowire following the removal of the dummy gate stack.

18. The method of claim 17, wherein the removing exposed portions of the first nanowire and the second nanowire to define the elliptical cross-sectional shape in the first nanowire and the second nanowire includes performing a hydrogen annealing process.

* * * * *